US008352900B1

(12) United States Patent
Wu

(10) Patent No.: US 8,352,900 B1
(45) Date of Patent: Jan. 8, 2013

(54) ANALYTIC EXPERIMENTAL ESTIMATOR FOR IMPACT OF VOLTAGE-OVERSHOOT OF VOLTAGE WAVEFORM ON DIELECTRIC FAILURE/BREAKDOWN

(75) Inventor: Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/356,681

(22) Filed: Jan. 24, 2012

(51) Int. Cl.
*G06F 17/50* (2006.01)
(52) U.S. Cl. ...................................... 716/136
(58) Field of Classification Search .................. 716/136
See application file for complete search history.

(56) References Cited

U.S. PATENT DOCUMENTS

| | | | |
|---|---|---|---|
| 6,766,274 B2 * | 7/2004 | Puthucode | 702/181 |
| 6,807,507 B2 | 10/2004 | Kumar et al. | |
| 7,937,674 B2 | 5/2011 | White et al. | |
| 2003/0028352 A1 * | 2/2003 | Puthucode | 702/181 |
| 2009/0287944 A1 | 11/2009 | Bilak | |
| 2010/0088660 A1 | 4/2010 | Kim et al. | |
| 2011/0074215 A1 * | 3/2011 | Vartanian et al. | 307/46 |
| 2011/0101990 A1 | 5/2011 | Noorlag et al. | |

\* cited by examiner

*Primary Examiner* — Suchin Parihar
(74) *Attorney, Agent, or Firm* — Gibb & Riley, LLC; Michael J. LeStrange, Esq.

(57) ABSTRACT

A method tests integrated circuit devices to measure a voltage overshoot condition. The method determines an overshoot time proportion. The overshoot time proportion is the amount of time the voltage overshoot condition occurs relative to the amount of time the normal operating condition occurs during a full useful operating lifetime of the integrated circuit devices. The method also determines an overshoot failure proportion. The overshoot failure proportion comprises the amount of dielectric failures that occur during the voltage overshoot condition relative to the amount of dielectric failures that occur during the normal operating condition. The method calculates an allowed overshoot voltage based on the overshoot time proportion and the overshoot failure proportion. The method additionally calculates an average overshoot voltage of a voltage waveform and compares the average overshoot voltage to the allowed overshoot voltage to identify if the average overshoot voltage exceeds the allowed overshoot voltage.

24 Claims, 5 Drawing Sheets

ANALYTIC EXPERIMENTAL ESTIMATOR FOR IMPACT OF VOLTAGE-OVERSHOOT OF VOLTAGE WAVEFORM ON DIELECTRIC FAILURE/BREAKDOWN

BACKGROUND

The present disclosure relates to designing and testing integrated circuit devices, and more specifically, to methods and systems that determine the affect of voltage overshoot conditions on the dielectrics within such integrated circuit devices.

The maximum operating voltages for microelectronic circuits/products are known to strongly relate to the failure or breakdown of dielectric insulator materials used in microelectronic circuits. The maximum voltages can be traditionally estimated according to dielectric failure models with the assumptions that these operating voltages remain constant within a cycle. In other words, time-dependence of any voltage waveform in terms of voltage-overshoot is neglected conventionally. Currently, there is no simple and straightforward methodology to quantitatively estimate the impact of the voltage-overshoot/undershoot of any waveforms on dielectric failure reliability.

SUMMARY

An exemplary method herein tests integrated circuit devices using testing equipment connected to the integrated circuit devices to measure a voltage overshoot condition that occurs when a voltage of the integrated circuit devices exceeds a base operating voltage, and to measure a normal operating condition that occurs when the voltage of the integrated circuit devices does not exceed the base operating voltage. This method also determines a failure fraction for the normal operating condition, using a computerized machine having access to the historical data. The failure fraction for the normal operating condition comprises a proportion of dielectric failures that occur during the normal operating condition. This method calculates an average overshoot voltage of a voltage waveform applied to the integrated circuit devices during the testing, using the computerized machine. This method determines, using the computerized machine, a failure fraction for the voltage overshoot condition. The failure fraction for the voltage overshoot condition comprises a proportion of the integrated circuit devices that experience dielectric failure during the voltage overshoot condition. The failure fraction for the voltage overshoot condition is based on the failure fraction for the normal operating condition and the average overshoot voltage. The method determines, using the computerized machine, a total failure fraction that comprises a summation of the failure fraction for the normal operating condition and the failure fraction for the voltage overshoot condition. The method compares the total failure fraction to a reliability target to identify whether the total failure fraction is acceptable, using the computerized machine, and reports whether the total failure fraction is acceptable from the computerized machine. This method can modify the fabrication processes for the integrated circuit devices if the total failure fraction is not acceptable, or modify the circuit design for the integrated circuit devices (to cause different voltage overshoot conditions) if the total failure fraction is not acceptable.

Another exemplary method herein tests integrated circuit devices using testing equipment connected to the integrated circuit devices to measure a voltage overshoot condition that occurs when a voltage of the integrated circuit devices exceeds a base operating voltage, and to measure a normal operating condition that occurs when the voltage of the integrated circuit devices does not exceed the base operating voltage. The testing is performed during a full useful operating lifetime of the integrated circuit devices and produces historical data. This method determines a burn-in time for the integrated circuit devices. This method also determines a failure fraction for the normal operating condition, using a computerized machine having access to the historical data and to the burn-in time for the integrated circuit devices. The failure fraction for the normal operating condition comprises a proportion of dielectric failures that occur during the normal operating condition. This method calculates an average overshoot voltage of a voltage waveform applied to the integrated circuit devices during the testing, using the computerized machine. This method determines, using the computerized machine, a failure fraction for the voltage overshoot condition. The failure fraction for the voltage overshoot condition comprises a proportion of the integrated circuit devices that experience dielectric failure during the voltage overshoot condition. The failure fraction for the voltage overshoot condition is based on the failure fraction for the normal operating condition and the average overshoot voltage and can additionally be based on a duty factor, a lifetime of power-on-hours, a maximum allowed voltage, a use temperature, and an area of gate dielectric. The method determines, using the computerized machine, a total failure fraction that comprises a summation of the failure fraction for the normal operating condition and the failure fraction for the voltage overshoot condition. The method compares the total failure fraction to a reliability target to identify whether the total failure fraction is acceptable, using the computerized machine, and reports whether the total failure fraction is acceptable from the computerized machine. This method can modify the fabrication processes for the integrated circuit devices if the total failure fraction is not acceptable, or modify the circuit design for the integrated circuit devices (to cause different voltage overshoot conditions) if the total failure fraction is not acceptable.

A system embodiment herein comprises test equipment connected to integrated circuit devices. The tests equipment tests the integrated circuit devices to measure a voltage overshoot condition that occurs when a voltage of the integrated circuit devices exceeds a base operating voltage, and to measure a normal operating condition that occurs when the voltage of the integrated circuit devices does not exceed the base operating voltage. The test equipment produces historical data. The system further includes a computerized machine having access to the historical data. The computerized machine determines a failure fraction for the normal operating condition. The failure fraction for the normal operating condition comprises a proportion of dielectric failures that occur during the normal operating condition. The computerized machine calculates an average overshoot voltage of a voltage waveform applied to the integrated circuit devices during the testing. The computerized machine determines a failure fraction for the voltage overshoot condition. The failure fraction for the voltage overshoot condition comprises a proportion of the integrated circuit devices that experience dielectric failure during the voltage overshoot condition. The failure fraction for the voltage overshoot condition is based on the failure fraction for the normal operating condition and the average overshoot voltage. The computerized machine determines a total failure fraction that comprises a summation of the failure fraction for the normal operating condition and the failure fraction for the voltage overshoot condition. The computerized machine compares the total failure fraction to a reliability target to identify whether the total failure fraction is acceptable and reports whether the total failure fraction is acceptable. The computerized machine can be used to modify the fabrication processes for the integrated circuit devices if the total failure fraction is not acceptable, or modify the circuit design for the integrated circuit devices (to cause different voltage overshoot conditions) if the total failure fraction is not acceptable.

A non-transitory computer storage medium embodiment herein is readable by a computerized device. The non-transitory computer storage medium stores instructions executable by the computerized device to perform a method. The method tests integrated circuit devices using testing equipment connected to the integrated circuit devices to measure a voltage overshoot condition that occurs when a voltage of the integrated circuit devices exceeds a base operating voltage, and to measure a normal operating condition that occurs when the voltage of the integrated circuit devices does not exceed the base operating voltage. This method also determines a failure fraction for the normal operating condition, using a computerized machine having access to the historical data. The failure fraction for the normal operating condition comprises a proportion of dielectric failures that occur during the normal operating condition. This method calculates an average overshoot voltage of a voltage waveform applied to the integrated circuit devices during the testing, using the computerized machine. This method determines a failure fraction for the voltage overshoot condition. The failure fraction for the voltage overshoot condition comprises a proportion of the integrated circuit devices that experience dielectric failure during the voltage overshoot condition. The failure fraction for the voltage overshoot condition is based on the failure fraction for the normal operating condition and the average overshoot voltage. The method determines a total failure fraction that comprises a summation of the failure fraction for the normal operating condition and the failure fraction for the voltage overshoot condition. The method compares the total failure fraction to a reliability target to identify whether the total failure fraction is acceptable and reports whether the total failure fraction is acceptable from the computerized machine. This method can modify the fabrication processes for the integrated circuit devices if the total failure fraction is not acceptable, or modify the circuit design for the integrated circuit devices (to cause different voltage overshoot conditions) if the total failure fraction is not acceptable.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, there is no simple and straightforward methodology to quantitatively estimate the impact of the voltage-overshoot/undershoot of any waveforms on dielectric failure reliability. Without a methodology that incorporates the impact of the voltage-overshoot/undershoot of any waveforms for dielectric failure estimation, microelectronic circuits can suffer significant failures. On the other hand, an approximation of voltage-overshoot with a rectangular waveform can be overly conservative, causing unnecessary performance degradation of circuit performance.

In view of these issues, systems and methods herein test integrated circuit devices to measure or to use circuit design tool to determine a voltage overshoot condition. The systems and methods herein additionally calculate an average overshoot voltage of a voltage waveform. The systems and methods herein determine an overshoot time proportion. The overshoot time proportion is the amount of time the voltage overshoot condition occurs relative to the amount of time the normal operating condition occurs during a full useful operating lifetime of the integrated circuit devices. The systems and methods herein also determine an overshoot failure proportion. The overshoot failure proportion comprises the amount of dielectric failures that occur during the voltage overshoot condition relative to the amount of dielectric failures that occur during the normal operating condition. The overshoot failure proportion is for the full useful operating lifetime of the integrated circuit devices. The systems and methods herein calculate an allowed overshoot voltage based on the overshoot time proportion and the overshoot failure proportion. The systems and methods herein compare the average overshoot voltage to the allowed overshoot voltage to identify if the failure fraction exceeds the allowed failure fraction by the reliability specification. Thus, the systems and methods herein can report whether the total failure fraction to allow the circuit designers or device manufacturers to adjust the voltage-overshoot or balance the trade-offs between the desired reliability specification and voltage-overshoot or device thickness or its fabrication process.

More specifically, the systems and methods herein address these issues by providing an analytic experimental estimator that centers on the idea that the voltage-overshoot relative to the baseline operating voltage (i.e. the ratio of voltage overshoot to the baseline voltage) depends on two factors. First, the ratio is proportional to the ratio of the failure fraction due to the voltage-overshoot to the failure fraction due to the baseline voltage. Secondly, this ratio is inversely proportional to the ratio of the total time of voltage-overshoot to the total time of the baseline operating voltage. Therefore, such proportional constants that can be derived by considering the breakdown probability statistics.

Figure 1:
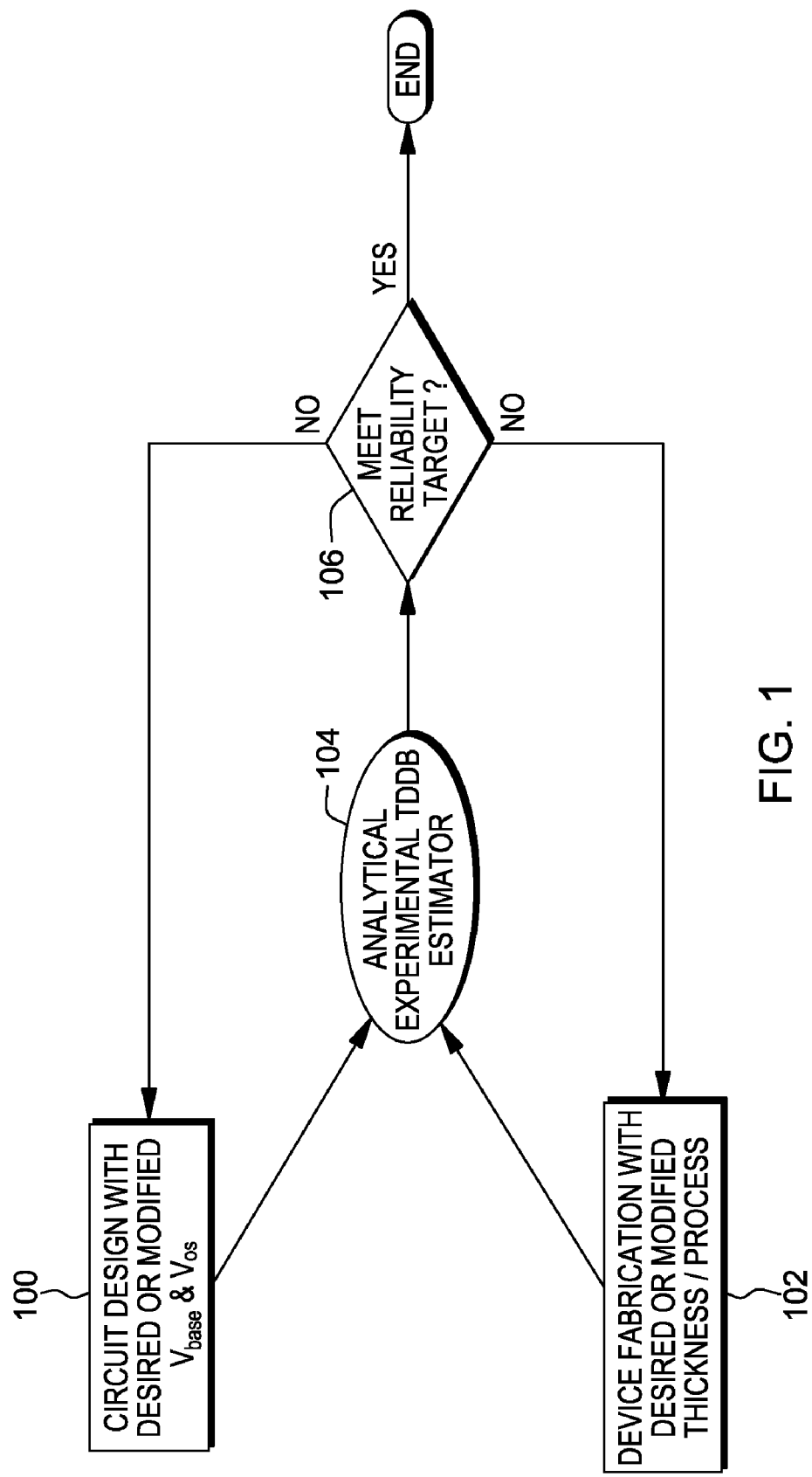
FIG. 1 is a flow diagram illustrating embodiments herein.

As shown in the flowchart in FIG. 1, an exemplary analytic experimental estimator 104 herein. Item 100 shows the circuit design with desired or modified $V_{base}$ and $V_{os}$. In item 102 the device is fabricated with desired or modified thickness/process. In item 104 the analytical experimental data collection/dielectric failure (TDDB) estimator performs parameter extraction. Next, the method determines, in item 106, if the target meets reliability. If the target meets reliability 106, then the method ends. If the target does not meet reliability in item 106, the method returns back to items 100 and 102 and repeats.

The following equation is used to calculate the failure fraction when burn-in (BI) is performed on integrated circuit devices for a given base voltage ($V_{USE}$), that is no voltage overshoot.

$$F_{cum} = 10^6 \frac{A_{OX}}{Z^\beta} \left\{ (D_f t_{POH} + t_{EQBI})(V_{USE})^{N_V} \exp\left[\frac{-\Delta H}{K_B(T_{USE} + 273)}\right] \right\}^\beta - \quad [1]$$

-continued $$\left.\left(t_{BI}D_{fBI}(V_{BI})^{N_V}\exp\left[\frac{-\Delta H}{K_B(T_{BI}+273)}\right]\right)^\beta\right\}$$

where $D_f$ is Duty factor and $t_{POH}$ is the lifetime in power-on-hours (POH). $F_{cum}$ is the cumulative failure fraction in ppm (parts per million) at the lifetime, $t_{POH}$.

The variable $V_{USE}$ can be the desired base operating voltage at use for the calculated failure fraction above. The variable $T_{USE}$ is the use temperature. $A_{OX}$ is the area of gate dielectric in mm² at use. Temperatures are given in Celsius (° C.). $K_B$ is the Boltzmann constant and equals to $8.62 \times 10^{-5}$ eVK$^{-1}$. The variable $t_{EQBI}$ is the equivalent burn-in time which can be calculated from the following equation [2].

$$t_{EQBI} = t_{BI}D_{fBI}\left(\frac{V_{BI}}{V_{USE}}\right)^{N_V}\exp\left[\frac{\Delta H}{K_B}\left(\frac{1}{(T_{USE}+273)} - \frac{1}{(T_{BI}+273)}\right)\right] \quad [2]$$

where $t_{BI}$ is the burn-in time in hours, $V_{BI}$ is the burn-in voltage and $T_{BI}$ is the burn-in temperature. The variable $D_{fBI}$ is the duty factor during burn-in. If burn-in is not applied, then $t_{BI}$ is zero. Thus, the second term in Eq. [1] vanishes. Then, $t_{EQBI}$ in the Eqs. [1] and [2] also equals to zero.

The constants, $N_V$, $\beta$, $\Delta H$, and $Z$ are the power-law exponent for the power-law of the adopted voltage acceleration model, Weibull slope, temperature activation energy, and the scaling factor, respectively. $N_V$ and $\beta$ are dimensionless while $\Delta H$ and $Z$ are in units of eV and s·V$^{N_V}$A$^{1/\beta}$, respectively.

The equation for failure fraction due to voltage overshoot is as follows.

$$F_{os} = F_{cum}\left(\frac{\langle V_{os}\rangle}{V_{USE}}\right)^{N_V\beta}\left(\frac{t_{os}}{(3600 t_{POH}D_f) - t_{os}}\right)^\beta$$

The variable $F_{os}$ is the failure fraction in ppm due to the voltage overshoot. The variable $F_{cum}$ can be obtained from Eq. [1], corresponding to $V_{USE}$ but without voltage overshoot. It can be calculated using Eq. [1]. $\langle V_{os}\rangle$ is the average overshoot voltage which can be obtained from the integration of the waveform supplied either by experimental testing or circuit designing software:

$$\langle V_{os}\rangle = \frac{1}{\tau_p}\int_0^{\tau_p} V(t)dt + V_{USE} \quad [4]$$

with $\tau$ being the characteristic time or pulse time for the voltage overshoot within a cycle as shown in FIG. 1. The variable $t_{os}$ is the total time of voltage-overshoot in seconds. Notice $t_{os}$ is in seconds as compared to $t_{POH}$ which is in hours. It can be calculated as follows:

$$t_{os} = t_{POH}D_f\frac{\tau_p}{\tau_{clock}}A_F \quad [5]$$

where $\tau_{clock}$ is the clock time, $\tau_p$ is the pulse time for overshoot, and $A_F$ is the activity-factor.

The total failure fraction in ppm can be calculated using the results from Eqs. [1] and [2] as follows. This total failure fraction can be compared with the reliability specification to check the calculated failure fraction meets the reliability specification.

$$F_{total} = F_{cum} + F_{os} \quad [6]$$

The examples of the use are shown in the above equations. The table below illustrates the constants used in the calculations.

| Scaling factor Z | Nv | ΔH (eV) | B |
|---|---|---|---|
| 45000 | 44 | 0.5 | 2.0 |

The table below illustrates the use condition specification.

| Vuse (V) | T (° C.) | Area (mm²) | $t_{POH}$ (hours) | Duty factor |
|---|---|---|---|---|
| 1.0 | 125 | 0.5 | 100,000 | 50% |

The table below illustrates the burn-in condition specification.

| $V_{BI}$ (V) | $T_{BI}$ (° C.) | $t_{BI}$ (hours) | Duty factor |
|---|---|---|---|
| 1.5 | 140 | 100 | 50% |

Regarding the overshoot-voltage specification, the methods and systems herein consider an exemplary clock frequency of 1.0 GHZ or 1 ns for $\tau_{clock}$. The waveform for voltage-transient is given in FIG. 2 with a peak voltage of 1.20V and pulse time ($\tau_p$) of 0.05 ns. The integration of the waveform yields the average voltage of $\langle V_{os}\rangle$=1.10V with an activity factor ($A_F$) of 0.15 (15%). Using eq. [5], the methods and systems herein obtains the value of $t_{os}$ to be 1,350,000 seconds.

Figure 2:
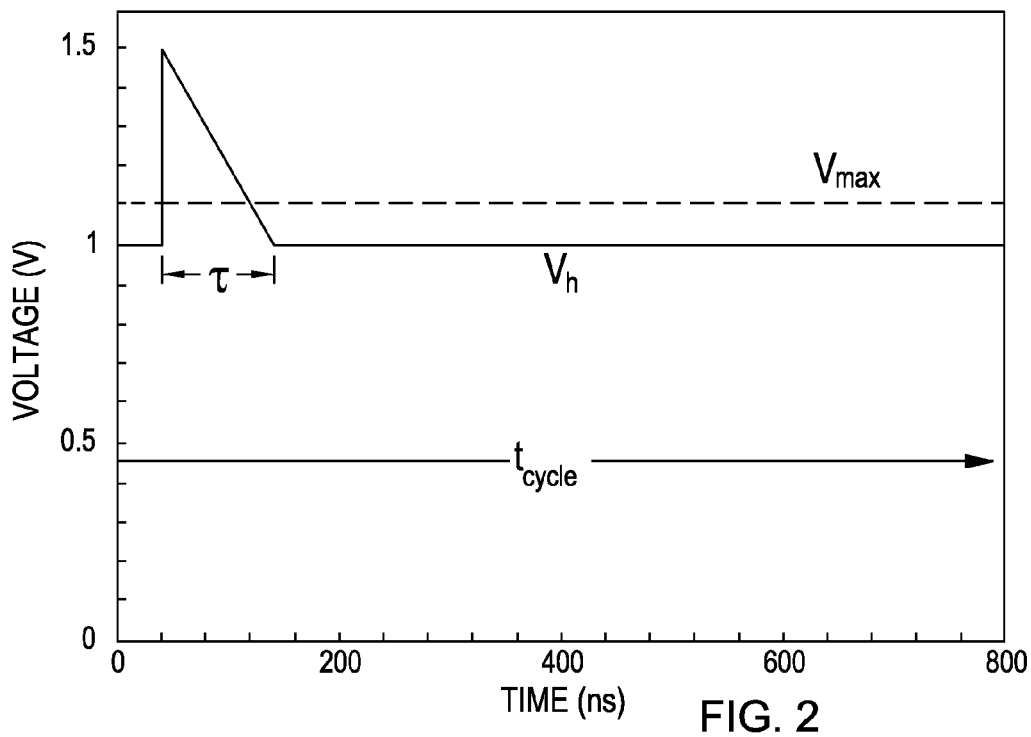
FIG. 2 is a chart showing an example of voltage-overshoot waveform.

FIG. 2 illustrates voltage waveform with the overshoot peak voltage at 1.2V and $V_{USE}$(base) of 1.00V.

Figure 3:
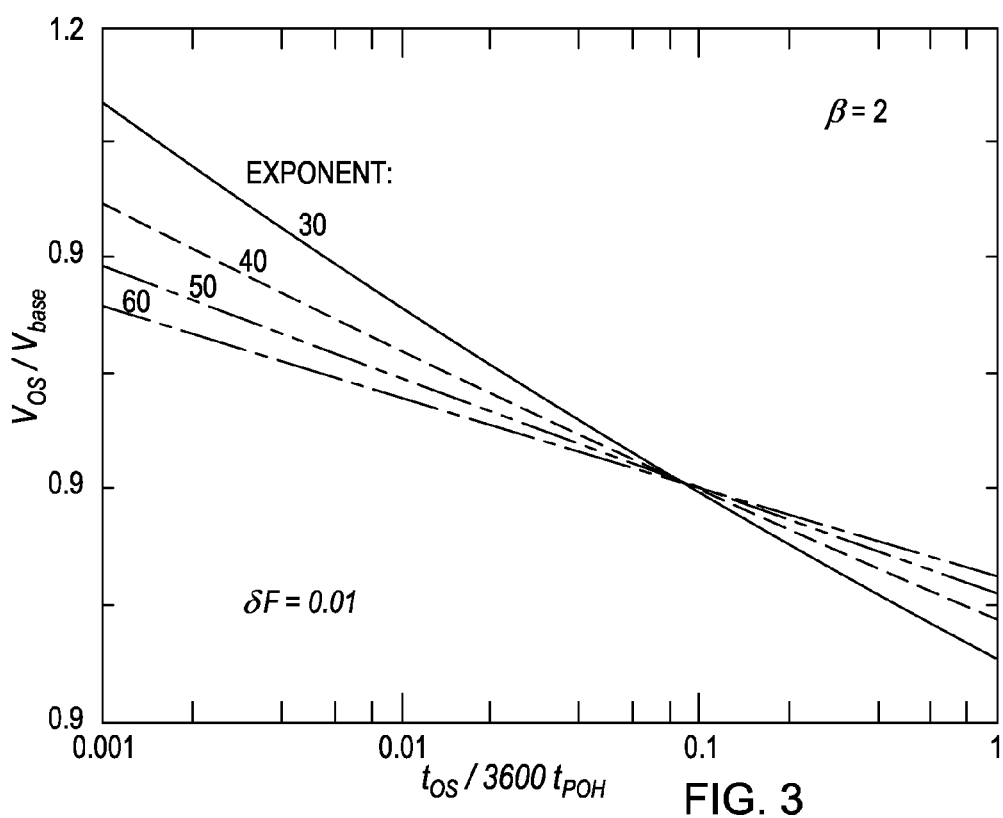
FIG. 3 is a chart showing the relative voltage-overshoot as a function of fractional lifetime.

An example of the allowed voltage overshoot is shown in FIG. 3.

The table below illustrates the summary of the calculated results from Eqs. [1] and [3].

| Without burn-in | | | With burn-in | | |
|---|---|---|---|---|---|
| $F_{cum}$ | $F_{os}$ | $F_{total}$ | $F_{cum}$ | $F_{os}$ | $F_{total}$ |
| 2.68 e−6 | 2.11 e−6 | 4.79 e−6 | 5.81 | 4.57 | 10-4 |

Figure 4:
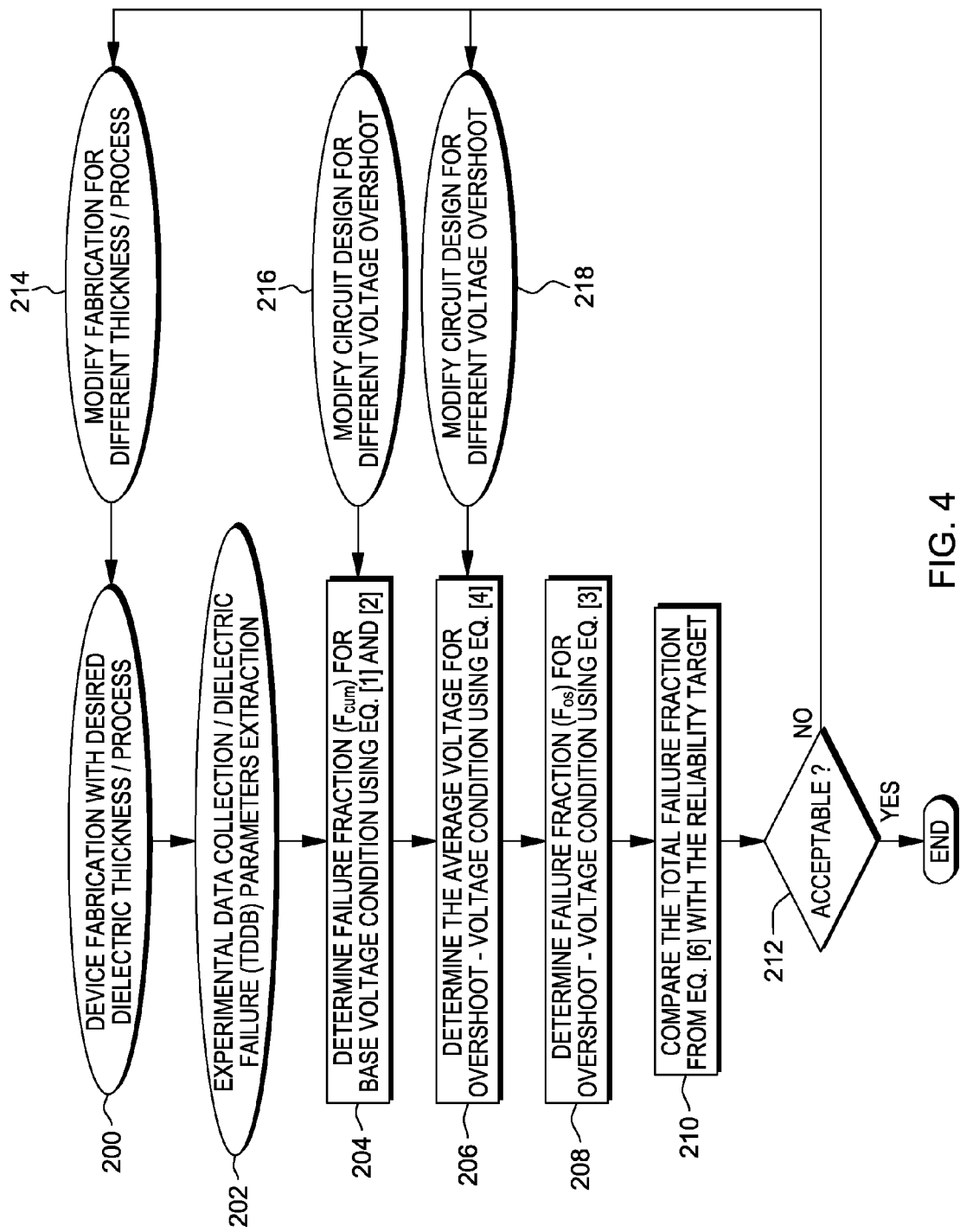
FIG. 4 is a flow diagram illustrating embodiments herein.

FIG. 4 is a flowchart that illustrates an exemplary method herein that begins in item 200 where the device is fabricated with the desired dielectric thickness/process. Next, in item 202, the experimental data collection/dielectric failure (TDDB) parameters extraction is done. More specifically, this method herein tests integrated circuit devices using testing equipment connected to the integrated circuit devices to measure a voltage overshoot condition that occurs when a voltage of the integrated circuit devices exceeds a base operating voltage, and to measure a normal operating condition that occurs when the voltage of the integrated circuit devices does not exceed the base operating voltage. The testing is performed during a full useful operating lifetime of the integrated circuit devices and produces historical data.

In item 204, the method determines the failure fraction ($F_{cum}$) for base voltage condition using Eq. [1] and [2], as discussed above. Thus, this method can also determine a burn-in time for the integrated circuit devices. More specifically, this method determines such a failure fraction for the normal operating condition, using a computerized machine having access to the historical data and to the burn-in time for the integrated circuit devices. The failure fraction for the normal operating condition comprises a proportion of dielectric failures that occur during the normal operating condition.

In item 206, the method determines the average voltage for overshoot-voltage condition using Eq. [4], as discussed above. More specifically, this method calculates an average overshoot voltage of a voltage waveform applied to the integrated circuit devices during the testing, using the computerized machine.

In item 208, the method determines failure fraction ($F_{os}$) for overshoot-voltage condition using Eq. [3], as discussed above. More specifically, this method determines, using the computerized machine, the failure fraction for the voltage overshoot condition. The failure fraction for the voltage overshoot condition comprises a proportion of the integrated circuit devices that experience dielectric failure during the voltage overshoot condition. The failure fraction for the voltage overshoot condition is based on the failure fraction for the normal operating condition and the average overshoot voltage and can additionally be based on a duty factor, a lifetime of power-on-hours, a maximum allowed voltage, a use temperature, and an area of gate dielectric.

In item 210, the method compares the total failure fraction from Eq. [6] (discussed above) with the reliability target. More specifically, this method determines, using the computerized machine, a total failure fraction that comprises a summation of the failure fraction for the normal operating condition and the failure fraction for the voltage overshoot condition. The method compares the total failure fraction to a reliability target to identify whether the total failure fraction is acceptable, using the computerized machine, and reports whether the total failure fraction is acceptable from the computerized machine.

This method can modify the fabrication processes for the integrated circuit devices if the total failure fraction is not acceptable, or modify the circuit design for the integrated circuit devices (to cause different voltage overshoot conditions) if the total failure fraction is not acceptable. More specifically, in item 212, if this is acceptable, the process is complete. If this is not acceptable in item 212, then the method continues to item 214-218. In item 214, the method modifies fabrication for different thickness/process, and then returns to item 200. In items 216, the method modifies the circuit design for different voltage overshoot, and then returns to item 204. In item 218, the method modifies the circuit design for different voltage overshoot, and then returns to item 206.

Figure 5:
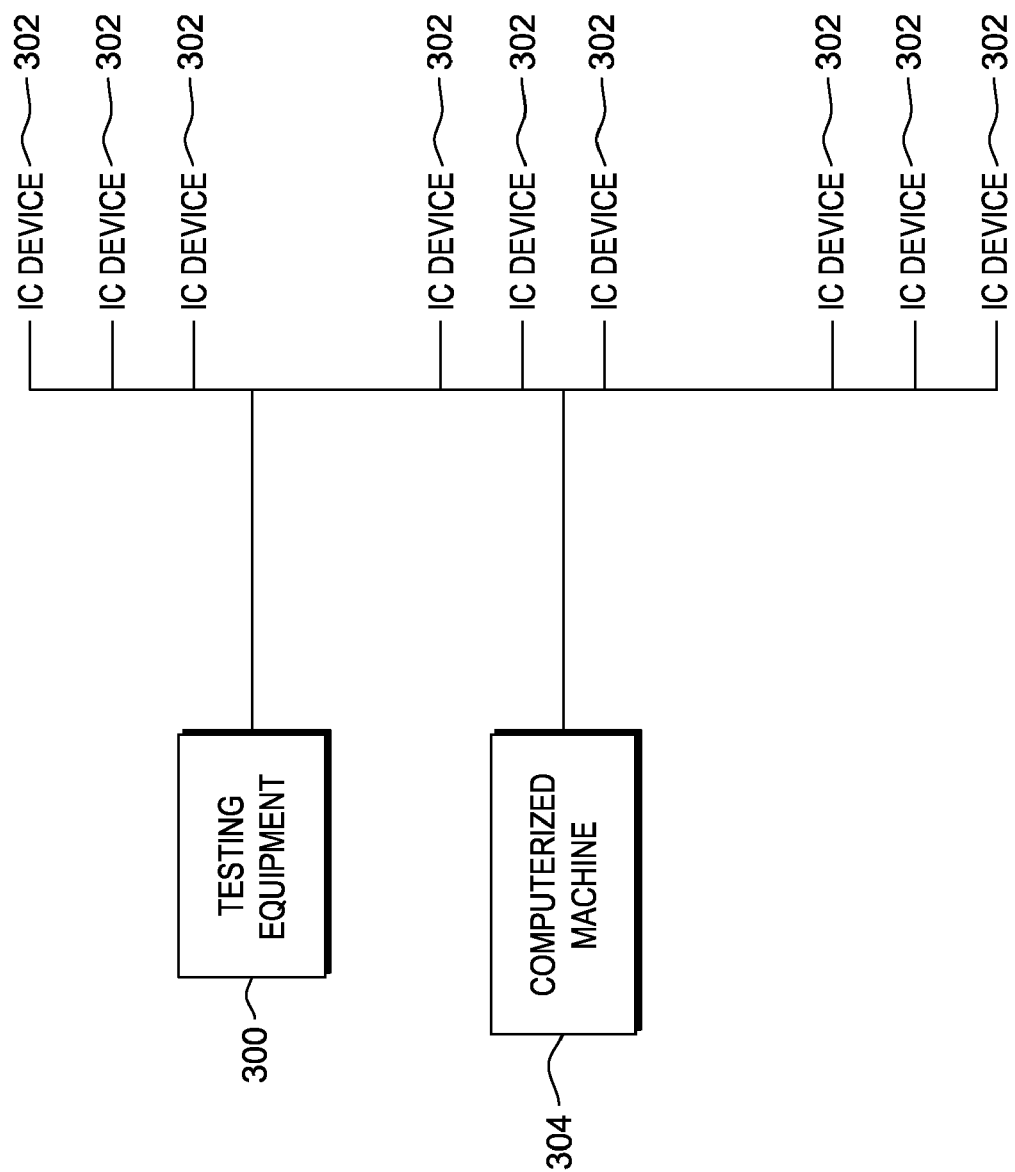
FIG. 5 is a schematic diagram of a hardware system according to embodiments herein.

FIG. 5 illustrates a system embodiment herein that comprises testing equipment 300 connected to integrated circuit devices 302 and a processor 304 (or some other form of computerized device). These various items 300, 302, 304 can be separate devices or can all be included on the same wafer or chip. The testing equipment 300 tests the integrated circuit devices 302 to measure the voltage overshoot condition that occurs when a voltage of the integrated circuit devices 302 exceeds a base operating voltage, and to measure the normal operating condition that occurs when the voltage of the integrated circuit devices 302 does not exceed the base operating voltage. The testing equipment 300 produces historical data.

The system further comprises a computerized machine 304 having access to the historical data. The computerized machine 304 determines an overshoot time proportion (again comprising the amount of time the voltage overshoot condition occurs relative to the amount of time the normal operating condition occurs during a full useful operating lifetime of the integrated circuit devices 302). The computerized machine 304 determines an overshoot failure proportion (again comprising the amount of dielectric failures that occur during the voltage overshoot condition relative to the amount of dielectric failures that occur during the normal operating condition, during the full useful operating lifetime of the integrated circuit devices 302). The computerized machine 304 calculates the allowed overshoot voltage based on the overshoot time proportion and the overshoot failure proportion. The computerized machine 304 calculates an average overshoot voltage of a voltage waveform and compares the average overshoot voltage to the allowed overshoot voltage to identify if the average overshoot voltage exceeds the allowed overshoot voltage. Thus, the computerized machine 304 can report whether the average overshoot voltage exceeds the allowed overshoot voltage.

A non-transitory computer readable storage medium embodiment herein is readable by a computerized device. The non-transitory computer readable storage medium stores instructions executable by the computerized device to perform a method that tests integrated circuit devices to measure a voltage overshoot condition.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
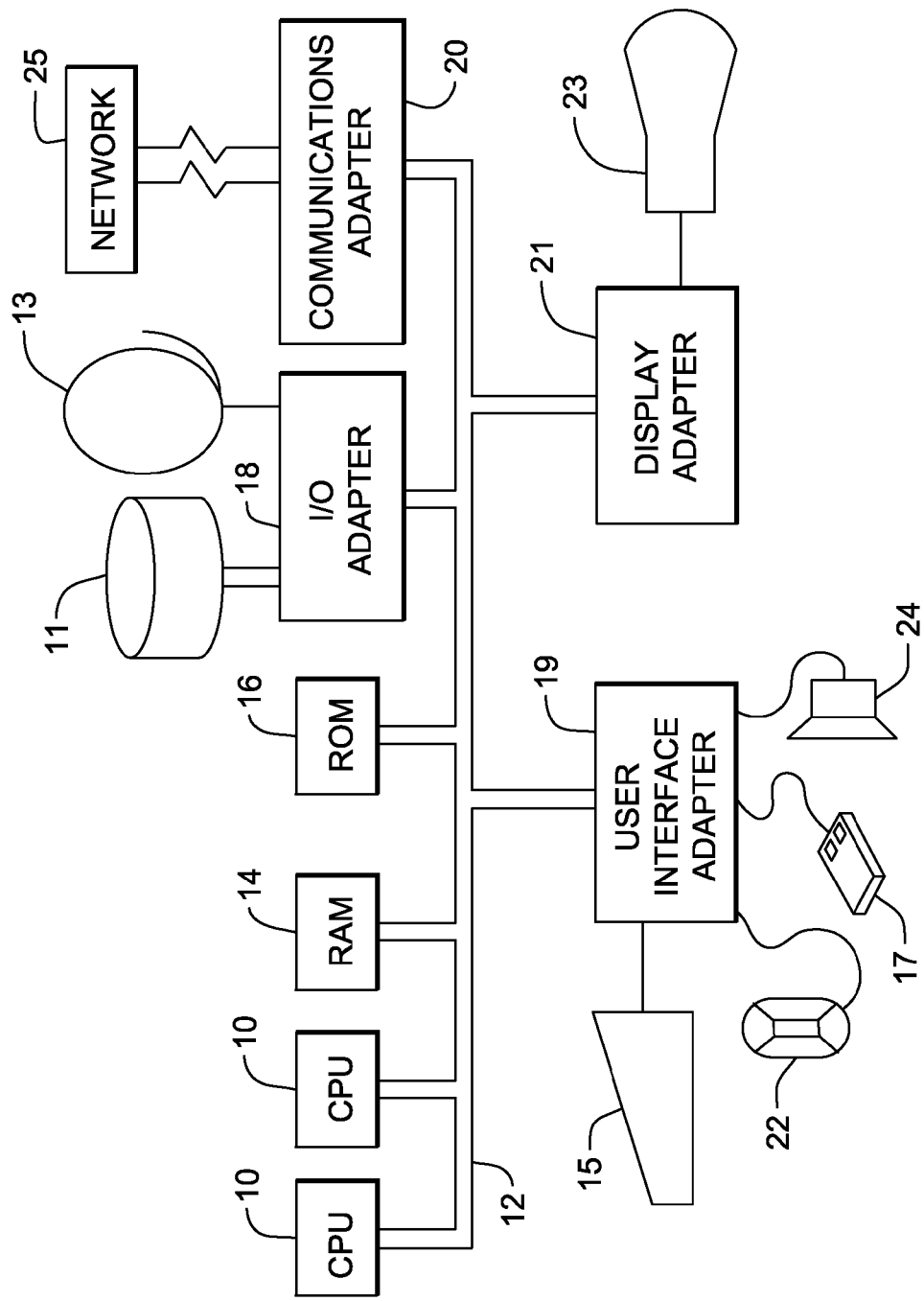
FIG. 6 is a schematic diagram of a hardware system according to embodiments herein.

A representative hardware environment for practicing the embodiments herein is depicted in FIG. 6. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

Deployment Types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, and then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    testing integrated circuit devices using testing equipment connected to said integrated circuit devices to measure a voltage overshoot condition that occurs when a voltage of said integrated circuit devices exceeds a base operating voltage, and to measure a normal operating condition that occurs when said voltage of said integrated circuit devices does not exceed said base operating voltage, said testing producing historical data;
    determining a failure fraction for said normal operating condition comprising a proportion of dielectric failures that occur during said normal operating condition, using a computerized machine having access to said historical data;
    calculating an average overshoot voltage of a voltage waveform applied to said integrated circuit devices, using said computerized machine;
    determining, using said computerized machine, a failure fraction for said voltage overshoot condition comprising a proportion of said integrated circuit devices that experience dielectric failure during said voltage overshoot condition, said failure fraction for said voltage overshoot condition being based on said failure fraction for said normal operating condition and said average overshoot voltage;
    determining, using said computerized machine, a total failure fraction comprising a summation of said failure fraction for said normal operating condition and said failure fraction for said voltage overshoot condition;
    comparing said total failure fraction to a reliability target to identify whether said total failure fraction is acceptable, using said computerized machine; and
    reporting whether said total failure fraction is acceptable from said computerized machine.

2. The method according to claim 1, said determining of said failure fraction for said normal operating condition comprising a proportion of dielectric failures that occur during said normal operating condition during a full useful operating lifetime of said integrated circuit devices.

3. The method according to claim 1, further comprising modifying fabrication processes for said integrated circuit devices if said total failure fraction is not acceptable.

4. The method according to claim 1, further comprising modifying a circuit design for said integrated circuit devices if said total failure fraction is not acceptable.

5. The method according to claim 4, said modifying of said circuit design being directed toward causing different voltage overshoot conditions.

6. The method according to claim 1, said determining of said failure fraction for said voltage overshoot condition being based on a duty factor, a lifetime of power-on-hours, a maximum allowed voltage, a use temperature, and an area of gate dielectric.

7. A method comprising:
    testing integrated circuit devices using testing equipment connected to said integrated circuit devices to measure a voltage overshoot condition that occurs when a voltage of said integrated circuit devices exceeds a base operating voltage, and to measure a normal operating condition that occurs when said voltage of said integrated circuit devices does not exceed said base operating voltage, said testing producing historical data;
    determining a burn-in time for said integrated circuit devices;
    determining a failure fraction for said normal operating condition comprising a proportion of dielectric failures that occur during said normal operating condition, using a computerized machine having access to said historical data and to said burn-in time for said integrated circuit devices;
    calculating an average overshoot voltage of a voltage waveform applied to said integrated circuit devices during said testing, using said computerized machine;
    determining, using said computerized machine, a failure fraction for said voltage overshoot condition comprising a proportion of said integrated circuit devices that experience dielectric failure during said voltage overshoot condition, said failure fraction for said voltage overshoot condition being based on said failure fraction for said normal operating condition and said average overshoot voltage;
    determining, using said computerized machine, a total failure fraction comprising a summation of said failure fraction for said normal operating condition and said failure fraction for said voltage overshoot condition;
    comparing said total failure fraction to a reliability target to identify whether said total failure fraction is acceptable, using said computerized machine; and
    reporting whether said total failure fraction is acceptable from said computerized machine.

8. The method according to claim 7, said determining of said failure fraction for said normal operating condition comprising a proportion of dielectric failures that occur during said normal operating condition during a full useful operating lifetime of said integrated circuit devices.

9. The method according to claim 7, further comprising modifying fabrication processes for said integrated circuit devices if said total failure fraction is not acceptable.

10. The method according to claim 7, further comprising modifying a circuit design for said integrated circuit devices if said total failure fraction is not acceptable.

11. The method according to claim 10, said modifying of said circuit design being directed toward causing different voltage overshoot conditions.

12. The method according to claim 7, said determining of said failure fraction for said voltage overshoot condition being based on a duty factor, a lifetime of power-on-hours, a maximum allowed voltage, a use temperature, and an area of gate dielectric.

13. A system comprising:
testing equipment connected to integrated circuit devices, said testing equipment testing said integrated circuit devices to measure a voltage overshoot condition that occurs when a voltage said integrated circuit devices exceeds a base operating voltage, and to measure a normal operating condition that occurs when said voltage of said integrated circuit devices does not exceed said base operating voltage, said testing equipment producing historical data; and
a computerized machine having access to said historical data, said computerized machine determining an overshoot time proportion comprising an amount of time said voltage overshoot condition occurs relative to an amount of time said normal operating condition occurs during a full useful operating lifetime of said integrated circuit devices,
said computerized machine determining a failure fraction for said normal operating condition comprising a proportion of dielectric failures that occur during said normal operating condition;
said computerized machine calculating an average overshoot voltage of a voltage waveform applied to said integrated circuit devices;
said computerized machine determining a failure fraction for said voltage overshoot condition comprising a proportion of said integrated circuit devices that experience dielectric failure during said voltage overshoot condition, said failure fraction for said voltage overshoot condition being based on said failure fraction for said normal operating condition and said average overshoot voltage;
said computerized machine determining a total failure fraction comprising a summation of said failure fraction for said normal operating condition and said failure fraction for said voltage overshoot condition;
said computerized machine comparing said total failure fraction to a reliability target to identify whether said total failure fraction is acceptable; and
said computerized machine reporting whether said total failure fraction is acceptable.

14. The system according to claim 13, said determining of said failure fraction for said normal operating condition comprising a proportion of dielectric failures that occur during said normal operating condition during a full useful operating lifetime of said integrated circuit devices.

15. The system according to claim 13, further comprising said computerized machine modifying fabrication processes for said integrated circuit devices if said total failure fraction is not acceptable.

16. The system according to claim 13, further comprising said computerized machine modifying a circuit design for said integrated circuit devices if said total failure fraction is not acceptable.

17. The system according to claim 16, said modifying of said circuit design being directed toward causing different voltage overshoot conditions.

18. The system according to claim 13, said determining of said failure fraction for said voltage overshoot condition being based on a duty factor, a lifetime of power-on-hours, a maximum allowed voltage, a use temperature, and an area of gate dielectric.

19. A non-transitory computer storage medium readable by a computerized device, said non-transitory computer storage medium storing instructions executable by said computerized device to perform a method comprising:
testing integrated circuit devices using testing equipment connected to said integrated circuit devices to measure a voltage overshoot condition that occurs when a voltage of said integrated circuit devices exceeds a base operating voltage, and to measure a normal operating condition that occurs when said voltage of said integrated circuit devices does not exceed said base operating voltage, said testing producing historical data;
determining a failure fraction for said normal operating condition comprising a proportion of dielectric failures that occur during said normal operating condition, using a computerized machine having access to said historical data;
calculating an average overshoot voltage of a voltage waveform applied to said integrated circuit devices, using said computerized machine;
determining, using said computerized machine, a failure fraction for said voltage overshoot condition comprising a proportion of said integrated circuit devices that experience dielectric failure during said voltage overshoot condition, said failure fraction for said voltage overshoot condition being based on said failure fraction for said normal operating condition and said average overshoot voltage;
determining, using said computerized machine, a total failure fraction comprising a summation of said failure fraction for said normal operating condition and said failure fraction for said voltage overshoot condition;
comparing said total failure fraction to a reliability target to identify whether said total failure fraction is acceptable, using said computerized machine; and
reporting whether said total failure fraction is acceptable from said computerized machine.

20. The non-transitory computer storage medium according to claim 19, said determining of said failure fraction for said normal operating condition comprising a proportion of dielectric failures that occur during said normal operating condition during a full useful operating lifetime of said integrated circuit devices.

21. The non-transitory computer storage medium according to claim 19, further comprising modifying fabrication processes for said integrated circuit devices if said total failure fraction is not acceptable.

22. The non-transitory computer storage medium according to claim 19, further comprising modifying a circuit design for said integrated circuit devices if said total failure fraction is not acceptable.

23. The non-transitory computer storage medium according to claim 22, said modifying of said circuit design being directed toward causing different voltage overshoot conditions.

24. The non-transitory computer storage medium according to claim 19, said determining of said failure fraction for said voltage overshoot condition being based on a duty factor, a lifetime of power-on-hours, a maximum allowed voltage, a use temperature, and an area of gate dielectric.

* * * * *